United States Patent [19]

Soeldner et al.

[11] Patent Number: 5,329,266

[45] Date of Patent: Jul. 12, 1994

[54] MAGNET ASSEMBLY

[75] Inventors: Leonhard Soeldner, Schwaig, Fed. Rep. of Germany; Francis Davies, Oxford, Great Britain

[73] Assignees: Oxford Magnet Technology Ltd., Oxford, United Kingdom; Siemens Aktiengesellschaft, Munich, Fed. Rep. of Germany

[21] Appl. No.: 731,260

[22] Filed: Jul. 17, 1991

[30] Foreign Application Priority Data

Jul. 24, 1990 [GB] United Kingdom ............... 9016184

[51] Int. Cl.$^5$ ............................................. H01F 7/22
[52] U.S. Cl. .................................. 335/216; 335/301; 324/319
[58] Field of Search .............. 335/216, 296, 297, 298, 335/299, 300, 301; 324/318, 319, 320

[56] References Cited

U.S. PATENT DOCUMENTS

| | | | |
|---|---|---|---|
| 4,587,504 | 5/1986 | Brown et al. | |
| 4,656,447 | 4/1987 | Keim et al. | 335/216 |
| 4,658,229 | 4/1987 | Chen et al. | 335/216 |
| 4,812,796 | 3/1989 | Ries | 335/299 |
| 4,812,797 | 3/1989 | Jayakumar | |
| 4,851,799 | 7/1989 | Hilal | 335/216 |
| 4,926,289 | 5/1990 | Reichart | |
| 4,931,735 | 6/1990 | Overweg et al. | 324/318 |
| 4,974,113 | 11/1990 | Garielese et al. | |

FOREIGN PATENT DOCUMENTS

| | | |
|---|---|---|
| 0144171 | 11/1984 | European Pat. Off. |
| WO89/09475 | 10/1989 | European Pat. Off. |
| 2951018 | 2/1982 | Fed. Rep. of Germany |
| 18618 | 1/1984 | Japan ................................. 335/299 |

OTHER PUBLICATIONS

Patent Abstracts of Japan, vol. 9, No. 305 (E-363) (2028), Dec. 3, 1985.
Patent Abstracts of Japan, vol. 13, No. 277 (E-778), Jun. 26, 1989.

Primary Examiner—Lincoln Donovan
Assistant Examiner—Raymond Barrera
Attorney, Agent, or Firm—Hill, Steadman & Simpson

[57] ABSTRACT

An active shield magnet has a plurality of screening coils which each have a small number of turns in comparison with the number of turns of the main magnet coil assemblies and which are connected in series in a closed loop to reduce the effect of disturbing influences in a working volume of the magnet.

5 Claims, 4 Drawing Sheets

MAGNET ASSEMBLY

FIELD OF THE INVENTION

The invention relates to a magnet assembly and particularly to an active-shield superconducting magnet assembly.

BACKGROUND OF THE INVENTION

An active-shield assembly is one in which an inner coil system and an outer coil system are connected in series to create magnetic fields in opposing directions so that a strong uniform magnetic field is created at the centre of the coil systems but the stray field prevailing outside the coil systems is very small.

Such an assembly is described in U.S. Pat. No. 4,587,504 issued on U.S. Ser. No. 669,311 filed Nov. 7, 1984, the contents of which are incorporated herein by reference. In the assembly described in U.S. Pat. No. 4,587,504, the coil systems creating the opposing magnetic fields are wound from superconducting wire. Superconducting coil systems are used in order to achieve strength and high precision of the magnetic field created in the centre of the coil systems. A prime application of these magnet assemblies is in NMR (nuclear magnetic resonance) imaging where these qualities are of vital importance.

In order to obtain an image of a subject using NMR techniques a steady background magnetic field is required which is uniform over the region to be imaged (the working volume).

Onto this uniform field are superimposed time-varying gradient magnetic fields which are used to encode position information into the image signal. A superconducting coil system is of particular advantage when the steady magnetic field strength is high, for example more than 0.3T, and the working volume is large, for example a sphere of 0.5 m diameter.

The superconducting condition of the coils is achieved by cooling the coils to very low temperatures, of the order of 4.2 K, using cryogenic techniques. In the superconducting condition, the wires can carry a very high current with negligible energy losses in the wire.

A conventional superconducting coil magnet (that is, a single coil system, without a balancing coil system as in an active shield assembly) has a further quality in that the magnetic disturbances to the magnetic field in the working volume due to external sources of magnetic field, such as other remote coil systems or magnetized objects, are automatically compensated to some degree. This arises from a quality of superconducting coils in that the current in a closed superconducting loop automatically changes in a sense to resist changes in the total magnetic flux threading the loop caused by external disturbing influences. The extent to which the magnetic disturbances are automatically compensated depends on, among other things, the geometry of the magnet and particularly its aspect ratio (the ratio of $d/1$ where d is the internal diameter of the magnet and 1 is its length). For a magnet having an aspect ratio of 2 or 3 such as might be used in an imaging application, the effect of an external disturbance is reduced by a factor of about 8 when compared with the field change that would occur if the magnet were absent. The theory underlying this self shielding effect is explained in more detail in U.S. Pat. No. 4,974,113 issued on Ser. No. 168,920 assigned to President and Fellows of Harvard College. This patent also describes arrangements of superconducting screening coils which are intended to reduce even further the effect of external disturbances.

However, a direct consequence of adding the outer coil system to form an active-shield assembly is that this automatic compensation is no longer effective in the working volume. The result is an increase in susceptibility to interference from external disturbing influences in an active-shield assembly as compared with a conventional single superconducting coil magnet. This interference is manifested by a distortion of the images which are produced by the interaction of the background and gradient fields in the working volume.

It is desirable to reduce the effect of disturbing influences on the magnetic field in the working volume of an active-shield assembly. In this regard it is important to consider not only the steady state condition of the assembly in which the current in the superconducting coils is substantially constant but also transient conditions in which the current is varying.

The most relevant of these transient conditions is a "quench" which is the term given for conversion of a coil from a superconducting state to a normal conducting state. A quench may occur unintentionally, due to local disturbances or structural deficiencies or it can be induced intentionally (for example, by means of local electrical heaters) as a way of rapidly reducing the magnetic field. This might be needed for example in a case where it is necessary to give urgent treatment to a patient undergoing an NMR procedure in the magnet assembly. When a quench occurs, there is a rapid increase in resistance in the quenched part of the coil which causes the energy stored in the coil system to be converted into heat. The heat is conducted to adjacent parts of the coil, causing these parts to quench. As an increasingly large part of the coil is quenched, the temperature associated with the heat energy increases, causing the resistance of the coil to rise further and accelerating the quench process until all the stored magnetic energy is converted into heat. This can occur extremely quickly, typically in about 10 to 20 seconds.

As described in U.S. Pat. No. 4,587,504 the coils of an active-shield magnet assembly are designed not only to produce a uniform magnetic field at the centre of the assembly but also to produce an external magnetic field which is as low as possible as close as possible to the assembly. The external magnetic field is termed herein the "stray field" and is commonly specified in terms of an ellipsoidal or cylindrical volume outside which the magnetic field due to the magnet assembly nowhere exceeds a specified level. This provides a way of denoting a safety zone a certain distance from the magnet. Any measures taken to reduce the effect of disturbing influences on the magnetic field in the working volume should preferably not be such as to cause the stray field to exceed its nominal limits, even during a quench.

U.S. Pat. No. 4,974,113 referred to above does not address specific problems associated with active-shield magnets or the difficulties arising during transient conditions.

An attempt to address these problems is proposed in EP-A-0299325 (Siemens) which describes an active-shield magnet in which the inner and outer magnet systems are decoupled by a superconducting current limiter. The current limiter permits slight current differences to exist between the inner and outer coil systems. As a result, magnetic field disturbances within each coil system can be compensated by a current modification.

While the theory is sound, there are considerable difficulties in achieving a reliable practical implementation based on this theory. In particular, for magnets of a size and geometry suitable for use in NMR applications, the current limiter must have a limiting current of less than 1 amp yet be able to withstand several hundred volts applied across its end if the stray field is to be maintained within bounds, even during quench conditions. A typical critical current density in a superconductor is about 4000 A per $mm^2$, so to achieve less than 1 amp it is necessary to use a very fine filament, of the order of 10 $\mu$m. Such a filament is both difficult to manufacture and to handle. Moreover, as the ends of the filament are adjacent in the coil as wound, very high insulation is necessary between the ends because of the high voltages which are developed. Thus the problem outlined above remains unsolved at a practical level.

SUMMARY OF THE INVENTION

To solve the above problems, there is provided in accordance with the present invention a magnet assembly comprising a first superconducting coil assembly for generating a first magnetic field; and a second superconducting coil assembly for generating a second magnetic field, the second superconducting coil assembly being electrically connected in series with the first superconducting coil assembly, wherein the first and second superconducting coil assemblies each generate, in use, magnetic fields whose corresponding components are of substantially the same order of magnitude, the assemblies being arranged such that a resultant, uniform magnetic field is generated in a working volume, and the second magnetic field substantially opposes the first magnetic field externally of the magnet assembly, wherein the assembly further includes a plurality of screening coils, each having a small number of turns in comparison with the number of turns in the first and second superconducting coil assemblies, the screening coils being electrically connected in series to form a closed loop and being arranged such that their interaction with the first and second superconducting coil assemblies serves to reduce the effect of disturbing influences on the magnetic field in the working volume of the magnet assembly while having an insignificant effect on the homogeneity of the magnetic field in the working volume.

By winding the screening coils at least in part from a superconducting wire of sufficiently low critical current, the maximum contribution they can make to the stray field can be rendered insignificant. As the number of turns of the screening coils is small compared with the number of turns of the first and second superconducting coil assemblies, a significant current must flow to generate even a tiny screening field. It is therefore easy to limit this current to a sensible value to provide adequate screening capacity without the risk of generating additional stray fields. For the avoidance of doubt, in this context "small relative to" means "at least an order of magnitude less than".

Preferably the second superconducting coil assembly is arranged coaxially with and radially outwardly of the first superconducting coil assembly, the coil assemblies being wound such that the current in the first coil assembly flows in an opposite direction to that in the second coil assembly. In this case some of the screening coils can be positioned close to coils on the second (outer) coil assembly and others close to the first (inner) coil assembly. However, they are all connected to generate magnetic fields in the same sense. This enables use to be made of the reverse connection of the outer coil assembly to provide a range of choice of mutual inductance with the superconducting coil assemblies to enhance the natural screening effect of the screening coils.

During a quench the rapid change of current in the first and second superconducting coils will couple, through the selected mutual inductance, to the screening coils. Where the screening coils are wound from a material having a low critical current this will result in these coils reverting from their superconducting state to the normal state so that no excess current can flow, and no damage will result. Alternatively, the screening coils can be wound from a wire with a high critical current, similar to that used for the first and second coil assemblies, but having as part of the closed loop a different wire of low critical current so that when this current is exceeded only this small part of the circuit becomes normally conducting so that the heat generation can be localised away from the first and second coil assemblies. If desired, this connection could be in the form of a superconducting switch with an electrical heater to force it into the normal state to reset the current in the screening coils to zero when required by a system operator.

In addition to a quench situation it is important also to take into account the effect of the small natural decay of the current in the magnet coils. This decay results from the small but finite resistance of the wire used in practical conductors, and is typically a few parts in $10^8$ per hour. The effect of this decaying current is to induce a compensating current in the screening coils which are coupled magnetically with the magnet coils. If the field produced by the screening coils has characteristics different from those of the main magnet, in particular a lower degree of homogeneity, the performance of the complete system will change with time. In conventional superconducting magnets (that is, not active shield systems) it is known to use superconducting shim coils to correct distortions in the magnetic field to improve its homogeneity. These shim coils can be designed so as not to couple with the main magnet by suitable placing of forward and reverse running coils near the main magnet coil. Such a solution is not applicable for use with the present invention, since decoupling the shim coils from the main magnet coils has the result that there is then no screening effect arising from the shim coils. Instead, a preferred embodiment of the invention provides a circuit operable to reset periodically the current in the screening coils to zero. In this way, an accumulation of current in the screening coils and consequent generation of a magnetic field which could destroy homogeneity in the working volume is avoided.

Particularly where the magnet assembly is used as part of NMR imaging apparatus it is not necessary for the loop to be completely superconducting provided that the time constant formed by the effective inductance and the resistance of the connections within the loop is very long compared with the time required to gather the data for an image. In this way the current in the screening coils will naturally return to zero over a long period without the need for periodic resetting by operation of a switch or as a result of exceeding the critical current and temporarily reverting to the normal conducting state.

For a better understanding of the present invention, and to show how the same may be carried into effect, reference will now be made by way of example to the accompanying drawings.

DESCRIPTION OF THE PREFERRED EMBODIMENT

Figure 1:
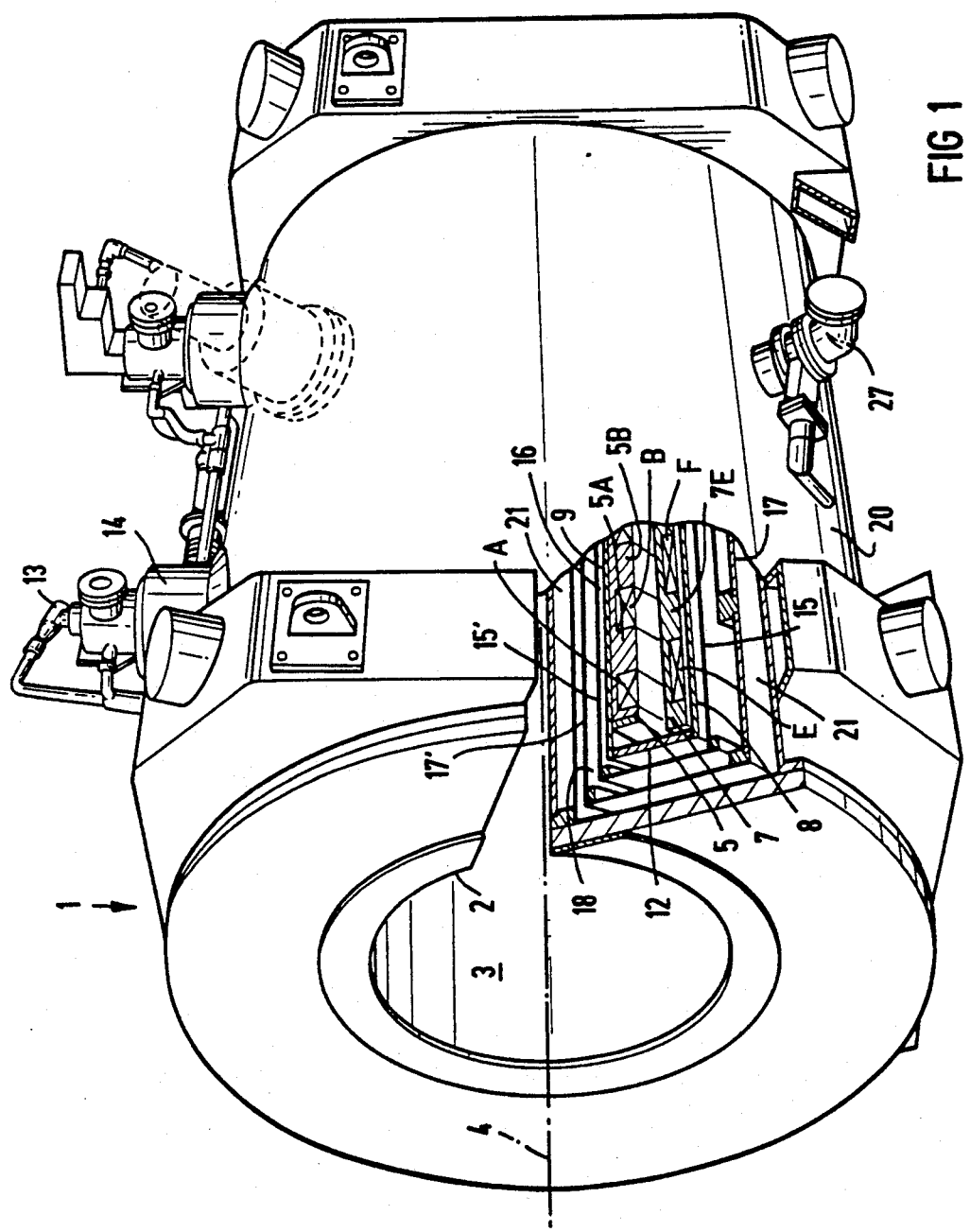
FIG. 1 is a partly cut away view of an example of a magnet assembly.

FIG. 1 illustrates in partly cut away form a magnet assembly 1. The magnet assembly 1 comprises an inner, cylindrical former 2 made of stainless steel defining the working volume of the magnet assembly constituted by a bore 3 having an axis 4. Positioned radially outwardly of the former 2 is a cylindrical, aluminium former 5 coaxial with the axis 4. The former 5 carries three pairs of coils A, A', B, B', C, C' arranged symmetrically about a mid-plane 6 (see FIG. 2) of the assembly normal to the axis 4 and a seventh coil D arranged symmetrically astride the mid-plane 6. These coils can be seen from FIG. 2. Each of the coils A–D is formed from a superconductive conducting material for example comprising fine strands of alloy Type II superconductor, a matrix of good normal conductor in which the superconductor strands are embedded in the form of a regular array, and a surface electrical insulation to cope with energisation and fault mode voltages. The position of each coil will be described later. Each of the coils A–D is wound separately, and has several thousand turns of wire. The coils are embedded in a wax or epoxy composition and may be surrounded by a clamping ring (not shown). In addition each pair of coils is positioned between respective pairs of annular ribs 5A, 5B etc. of the former 5. The purpose of the wax or epoxy composition and the ribs is to prevent movement of the windings of the coil in use and to try and prevent any small movements which might be accompanied by the generation of heat which could lead to quenching. In view of the close spacing of the coils A–D, the former 5 must be constructed to accommodate large forces between adjacent coils which, in the axial direction, can amount to some 200,000 Kgf. In addition, the former 5 must be as light as possible to reduce the overall weight of the magnet assembly and be as near to a right cylinder as possible.

A second, aluminium former 7 is mounted radially outwardly of the former 5. The former 7 carries four shielding coils E, E'-F, F' (see FIG. 2) arranged symmetrically about the mid-plane 6 of the magnet assembly in a manner to be described below. The coils E–F' are mounted between respective pairs of ribs 7E, 7F of the former 7 in a way similar to the coils A–D. Clamping rings (not shown) and wax or epoxy are used to reduce movement of the coil windings as described above in relation to the former 5.

In order that the windings of the coils A–F' can achieve their superconductive condition it is necessary to cool the windings to about 4.2K. This is the boiling point of helium and thus the two formers 5, 7 are positioned within a helium can defined by an outer cylindrical wall 8 and an inner cylindrical wall 9. The helium can is closed by a pair of ring members 12. The walls 8, 9 and ring members 12 are all made of stainless steel. Liquid helium is supplied to a helium can via an inlet 13 mounted in a turret 14. The helium can could alternatively be made from a metal which is more conductive than stainless steel, for example aluminium.

Cylindrical, aluminium radiation shields 15, 15' are mounted coaxially, radially outwardly and inwardly respectively about the helium can to define an evacuated space 16 between the shields 15, 15' and the helium can. The shields 15, 15' are cooled by contact with helium through the agency of a heat exchanger (not shown) in the turret 14 which extracts heat from the radiation shields 15, 15' and passes it to the cold helium gas that has been boiled from the helium can.

Further cooling of the shields to achieve a lower temperature may be achieved by a second heat exchanger connected to the second stage of a closed-cycle Gifford-McMahon refrigerator.

Further aluminium radiation shields 17, 17' are mounted coaxially, radially outwardly and inwardly respectively about the shields 15, 15' to define an evacuated space 18. In use, liquid nitrogen is supplied to an annular tank 26 of which the shield 17 forms the outer skin. These shields may be connected through a heat exchanger to the first stage of a 2-stage closed cycle Gifford-McMahon refrigerator which has sufficient cooling power to reduce or eliminate the boil off of nitrogen from the tank. Finally, a cylindrical stainless steel outer casing 20 is mounted coaxially about the shield 17 to define a vacuum space 21. The outer casing could alternatively be made of aluminium. Pairs of aluminium end plates 22,23,24 (see FIG. 2) are provided to close the ends of the spaces 16,18,21.

To minimise the heat load, the various shields are supported by a system of glass reinforced plastic rods (not shown) mounted in corresponding attachment plates. These rods when configured as a three dimensional array of struts will support a 4000 kilogram magnet at the expense of a heat leak of no more than 0.04 watts.

In use, the helium can 8,9 is filled with liquid helium which will be at 4.21K. As the liquid helium boils, the gas produced will pass into the heat exchanger in the turret 14 which will cool the shields 15, 15' to a temperature of about 40K. These shields are commonly referred to as the 40K heat shields. Liquid nitrogen present in the tank maintains the shields 17, 17' at a temperature of about 77K. These shields are commonly referred to as the 80K heat shield. These cold shields together with the vacuum contained within the spaces 16,18,21 help to minimise the heat input to the helium can which is maintained at 4.2K by the boiling of liquid helium.

The spaces 16,18,21 are connected through a valve 27 to the atmosphere to enable the spaces to be evacuated.

In another implementation the nitrogen tank 26 may be omitted when the shields 15,17 are cooled by a 2 stage Gifford-McMahon closed cycle refrigerator.

Figure 2:
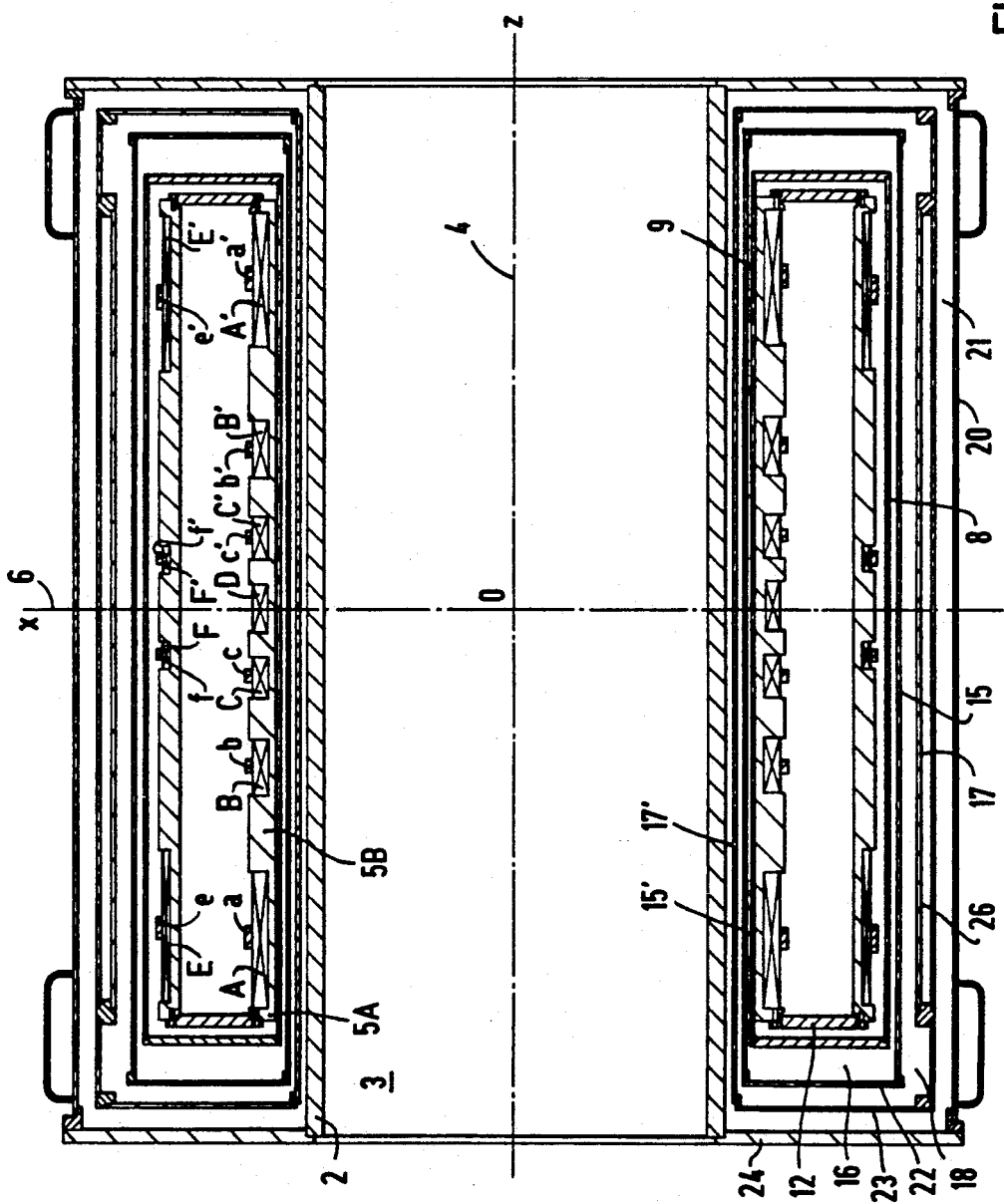
FIG. 2 is a longitudinal section of the assembly of FIG. 1.

The position of the components of the magnet system 1 may be better understood by reference to FIG. 2 which shows a radial cross-section through the assembly.

The principle of implementation of the present invention will now be described with reference to FIG. 3, which is a circuit diagram showing the connection of the magnet coils A–F' and a set of screening coils a–f' connected in series in a closed loop there being in the illustrated embodiment a screening coil adjacent to each magnet coil and designated in FIG. 3 by the relevant lower case letter. The screening coils are wound so that all the screening coils a-f' carry current in the same direction. The screening coils are wound with about 100 turns of superconducting wire.

The criteria for determining the dimensions of the screening coils a-f' are the mutual inductance with the magnet coils A-F', and the distortion of the uniform magnet field prevailing in the central zone 3 of the magnet system produced by a current $I_s$ in the screening coils. For a disturbing field $B_d$ the circuit equations for the magnet coils can be written as in Equation (1) and for the screening coils as in Equation (2), where the arrows → signify vector quantities, the subscripts s and m signify the screening coil set and magnet coil set respectively, and the integrals are evaluated over the area, of which dA is an element, enclosed by the circulating current.

If the disturbing field $B_d$ is uniform it may be taken outside the integral sign, and noting that $S_m \vec{d}A \approx 0$ for an active shield magnet, equation (1) reduces to equation (3).

Substituting the value of dt $$\frac{dI_m}{dt}$$

from equation (3) into equation (2) gives equation (4).

In a strong uniform field parallel to the coil axis any small field components normal to the axis have an insignificant effect on the total field strength. It is sufficient therefore to consider just the components of field parallel to the axis, in which case the contribution to central field of the screening coil system is indicated by equation (5) and the contribution of the magnet is indicated by equation (6), where $g_s$ and $g_m$ are constants determined by the coil geometry. The total change in the centre field $B_o$ is then represented by equation (7) as the sum of the disturbing fields $B_d$, $B_m$ and $B_s$.

Differentiating equation (7) with respect to time gives equation (7a). Substituting from equations (3) and (4) into equation (7a) gives equation (7b) which simplifies to equation (7c). Equation (7c) can be expressed in terms of the coupling factor K, where $$K^2 = \frac{M_{sm}^2}{L_s L_m},$$

as equation (7d).

For a coil where Ns is the number of turns and ri is the radius of the ith turn, $S_s \vec{d}\vec{A}$ simplifies to $$\pi \sum_{i=1}^{Ns} r_i^2 \cdot$$

which gives equation (8).

Perfect screening exists when there is no coupling between $$\frac{dB_o}{dt} \text{ and } \frac{dB_d}{dt},$$

i.e. when equation (9) is satisfied.

Adjusting the size and position of the screening coils relative to the magnet coils allows a wide range of values of K within the range:

$$-1 < K < 1$$

where negative values of K imply that the coupling with the outer coils E-F' is stronger than with the inner A-D. This allows a design to be found which satisfies the screening condition.

The other criterion to be considered is the homogeneity of the magnetic field component generated by the screening coils. As is well known in the art of magnetism and as is described in a paper by M. W. Garrett, Journal of Applied Physics Volume 22, page 1091,1951 entitled "Axially symmetric systems for generating and measuring magnetic fields", the homogeneity of the axisymmetric magnetic field in a spherical region can be expressed in terms of the spherical harmonic expansion shown in Equation 10, where $r_o$ is the radius of the spherical region of interest and $P_n(\cos \theta)$ are the Legendre polynomials.

With reference to equation 10, a homogeneous field is one for which $$A_o \neq 0$$

$$A_n = 0$$

$$n = 1 \ldots \infty$$

Although in most cases it will not be possible to achieve a design which simultaneously satisfies this requirement and equation (9), it is nevertheless possible by using these terms with appropriate weightings to form the object function of a suitable optimising computer program to find reasonable compromises for any particular case.

The criteria for determining how far equation (9) should be met can be derived by considering a conventional single superconducting magnet coil that is without an outer coil to serve as an active-shield assembly, in which case $$\frac{dB_o}{dB_d} \approx 0.1$$

It would be satisfactory to achieve this level of screening in the magnet assembly described herein. Furthermore the level of field change to be screened against is quite small. Changes of 100 nT have a significant effect on the image, but are experienced only rarely. A screening coil capable of producing a few $\mu$T before reaching its critical current would therefore be adequate. At this level of field the effect on the homogeneity of the background field would be negligible provided the screening field is homogeneous to 1% or so. This means that only the lowest orders (lowest values of n) of the field expansion expressed in equation (10) need to be considered in practice.

The flexibility in the choice of coupling factor K arising from an active shield magnet means that it is possible within the optimisation process to accept further constraints to simplify construction, for example that the screening coils lie on the surface of the magnet coils, and do not require an additional winding journal.

Figure 3:
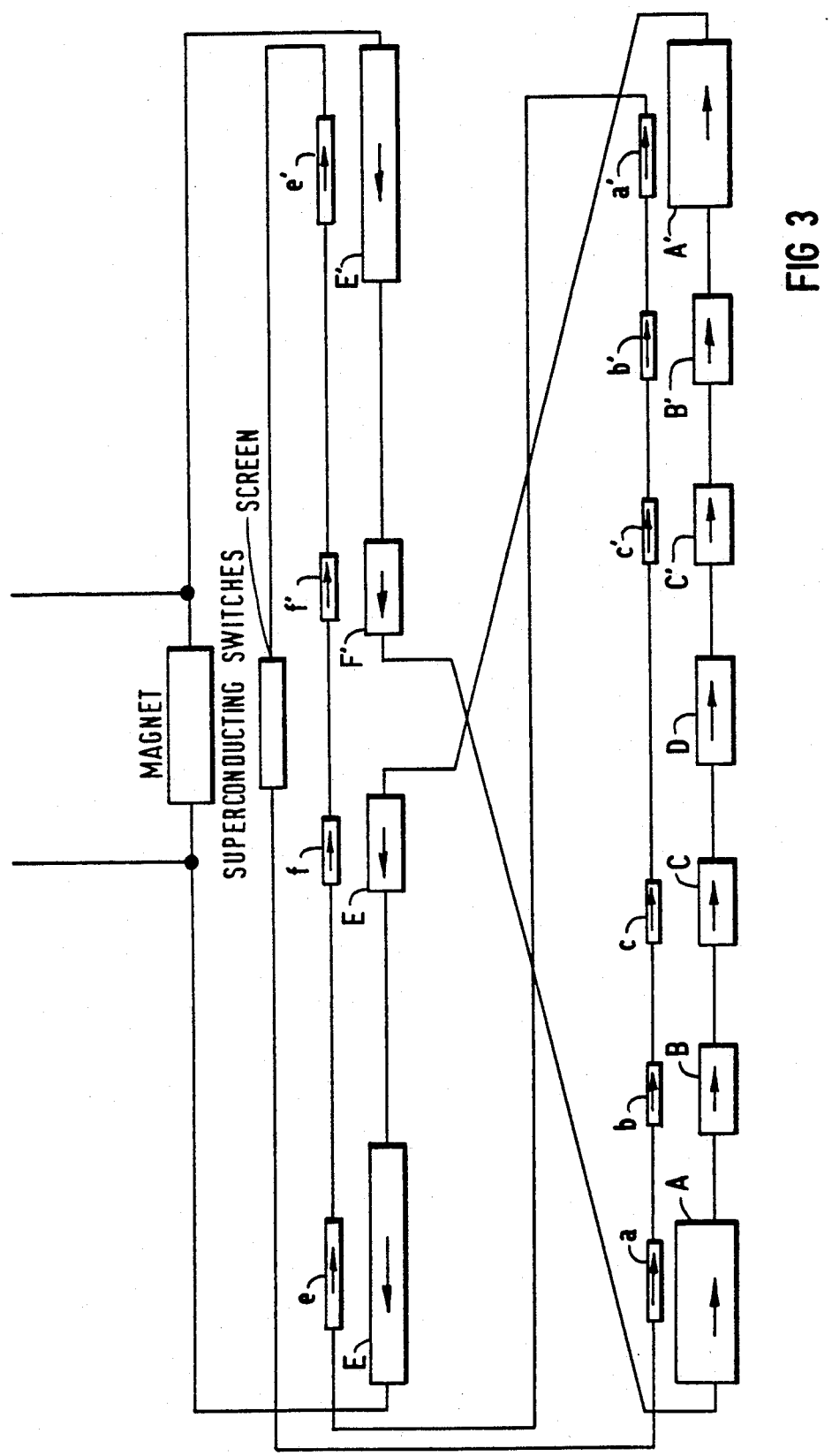
FIG. 3 is a circuit diagram for the assembly of FIG. 2, illustrating connection of the screening coils.

In the specific embodiment illustrated in FIG. 3, the screening coils are designed to provide screening against external disturbances for the magnet whose coil dimensions are listed in Table 1. The axial position is given in centimetres from the centre line OX. This magnet has a self inductance of 38.2 Henry, and produces a central field of 2.65 mT/amp.

The screening coils are wound in a single layer directly onto the outer surface of the magnet coils. The axial positions and dimensions of the screening coils are listed in Table 2. When connected in series all running in the same sense, as shown in FIG. 3, the self inductance of this set of coils is 76.9 mH and the central field contribution is 0.14 mT/amp. The coupling factor with the main coils is 0.21 and the screening factor.

$$\frac{dB_o}{dB_d} = 0.15$$

The field produced by the screening coils is homogeneous to 1.1% over a 50 cm diameter spherical region located about the magnet centre.

The screening coils are connected in series through a small superconducting switch 32 which serves two functions. It can be heated by a small heating element to drive it out of its superconducting state into a normal conducting state where its resistance is about 100 ohm. In this condition the current in the screening coils decays rapidly to zero, so the switch can be used during the running up or down of the main magnet to avoid coupling into the screening coils. It also has a current limiting function, due to its inherently very low critical current, whereby it switches to its normal conducting state if the current in the screening coils rises excessively, for example in the case when the magnet quenches. The main magnet coils are themselves connected through a main superconducting switch 30.

For the design listed in Table II a suitable switch would have a critical current of 10 amps or less, which is readily achieved using a fine superconducting wire without requiring special techniques. The maximum voltage than can be generated across this switch is very low, even during a quench.

Figure 4:
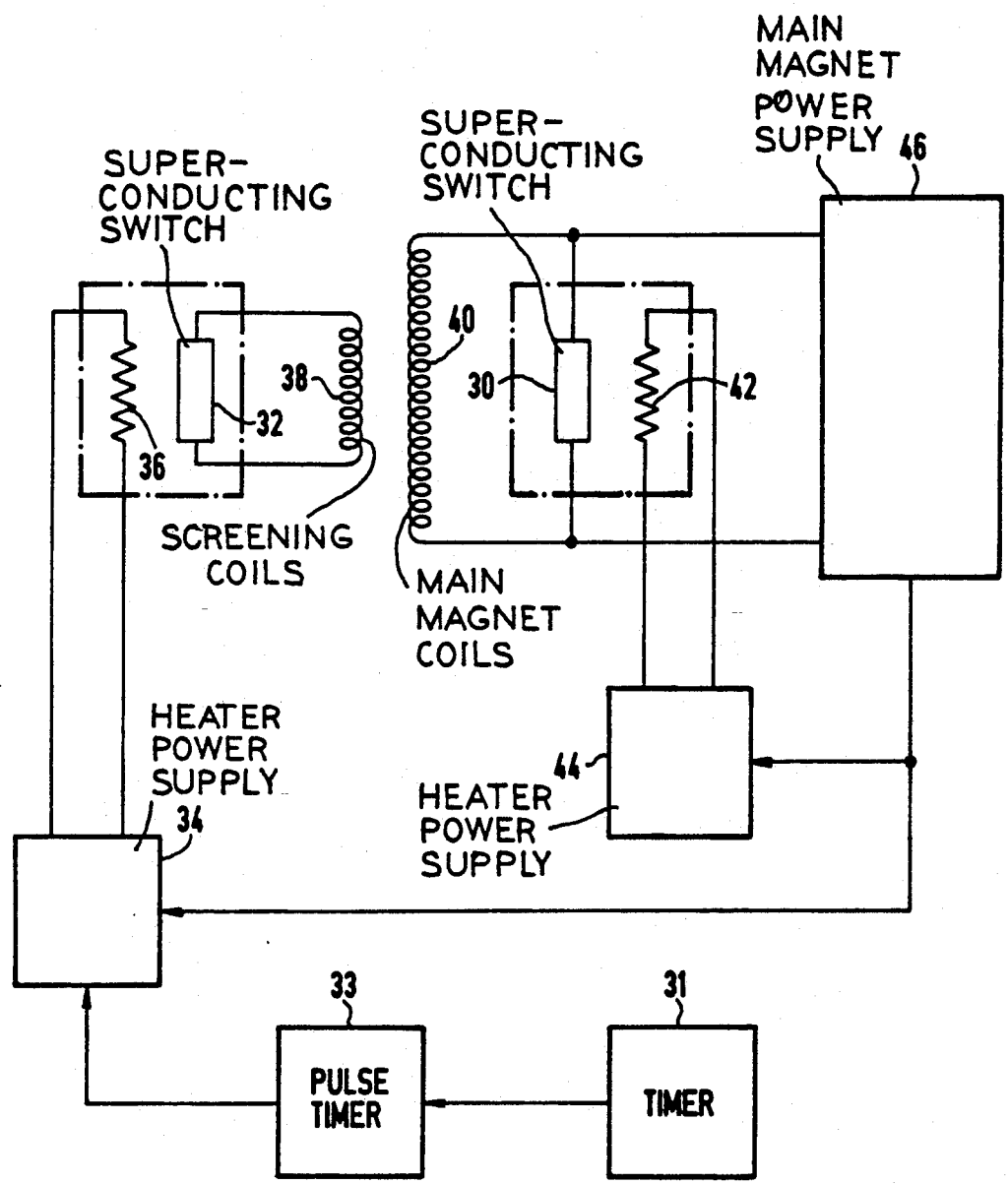
FIG. 4 is a diagram illustrating a circuit for resetting the current in the screening coils when required.

Although the screening coils are roughly homogeneous the effect of the natural decay of the main magnet current will be to increase the current in the screening coils steadily. If this current were allowed to reach about 10 amps, where it would be limited by the spontaneous transition to normal conduction in the switch, the effect on the field in the imaging region would be $10 \times 0.011 \times 0.14$ mT inhomogeneity, or 15 $\mu$T. For high performance applications, this is undesirable. To overcome this problem a resetting circuit can be provided, as shown in FIG. 4. The resetting circuit comprises a timing circuit 31 which provides a signal at preset intervals. Weekly intervals are generally considered sufficient although for high performance applications the timing circuit can be arranged to supply a signal every 24 hours. The signal is supplied to a pulse timer 33 which provides a pulse of fixed duration (e.g. 5 seconds) to a heater power supply 34.

The heater power supply 34 heats up a small heating element 36 for the superconducting switch 32. This is sufficient to allow the current in the screening coils to decay to zero, so that there is no accumulative effect on the homogeneity. The same device can also be arranged to energise the heating element 36 continuously while the magnet field is being charged, and for a short period thereafter when the natural decay rate is high. In FIG. 4, reference numeral 38 represents the screening coils and reference numeral 40 represents the coils of the main magnet. The main superconducting switch 30 is also associated with a heating element 42, powered by a separate supply 44. Both the power supplies 34,44 are controlled from a main magnet supply 46.

When the main magnet field is being changed the control signal from the magnet power supply 46 that energises the main switch heater 42 is also used to energise the screening coils switch heater 36. This ensures that there is no current in the screening coils while the main magnet current is being set, so that the current is set correctly for the required central magnetic field.

$$\frac{dB_o}{dt} = \frac{dB_s}{dt} + \frac{dB_m}{dt} + \frac{dB_d}{dt} \tag{7a}$$

$$\frac{dB_o}{dt} = g_s \left\{ \frac{-\frac{dB_d}{dt} \int_s dA}{L_s - \frac{M_{sm}^2}{L_m}} \right\} + \tag{7b}$$

$$g_m \left\{ \frac{-M_s}{L_m} \left\{ \frac{-\frac{dB_d}{dt} \int_s dA}{L_s - \frac{M_{sm}^2}{L_m}} \right\} \right\} + \frac{dB_d}{dt}$$

$$\frac{dB_c}{dt} = \tag{7c}$$

$$\frac{dB_d}{dt} \left[ 1 - g_s \left\{ \frac{\int_s dA}{L_s - \frac{M_{sm}^2}{L_m}} \right\} + \frac{M_s g_m}{L_m} \left\{ \frac{\int_s dA}{L_s - \frac{M_{sm}^2}{L_m}} \right\} \right]$$

$$\frac{dB_o}{dt} = \tag{7d}$$

$$\frac{dB_d}{dt} \left[ 1 + \frac{1}{\sqrt{L_s}} \left( \frac{\int_s dA}{1 - K^2} \right) \left( \frac{Kg_m}{\sqrt{L_m}} - \frac{g_s}{\sqrt{L_s}} \right) \right]$$

$$L_m \frac{dI_m}{dt} + M_{sm} \frac{dI_s}{dt} + \frac{d}{dt} \left( \int_m \bar{B}_d \cdot d\bar{A} \right) = 0 \tag{1}$$

$$M_{sm} \frac{dI_m}{dt} + L_s \frac{dI_s}{dt} + \frac{d}{dt} \left( \int_s \bar{B}_d \cdot d\bar{A} \right) = 0 \tag{2}$$

$$\frac{dI_m}{dt} + \frac{M_{sm}}{L_m} \frac{dI_s}{dt} = 0 \tag{3}$$

$$\left( L_s - \frac{M_{sm}^2}{L_m} \right) \frac{dI_s}{dt} + \frac{d\bar{B}_d}{dt} \cdot \int_s d\bar{A} = 0 \tag{4}$$

$$B_s = g_s I_s \tag{5}$$

$$B_m = g_m I_m \tag{6}$$

$$B_0 = B_s + B_m + B_d \tag{7}$$

$$\frac{dB_0}{dt} = \tag{8}$$

-continued $$\left[1+\left(\frac{Kg_m}{\sqrt{L_m}}-\frac{g_s}{\sqrt{L_s}}\right)\left(\frac{\pi \sum_{i=1}^{N_s} r_i^2}{\sqrt{L_s}\,(1-K^2)}\right)\right]\frac{dB_d}{dt} \quad (9)$$

$$1+\left(\frac{Kg_m}{\sqrt{L_m}}-\frac{g_s}{\sqrt{L_s}}\right)\left(\frac{\pi \sum_{i=1}^{N_s} r_i^2}{\sqrt{L_s}\,(1-K^2)}\right)=0 \quad$$

$$B=\mu_0 \sum_{n=0}^{\infty}\left(\frac{r}{r_0}\right)^n A_n\,P_n\,(\cos\theta) \quad (10)$$

TABLE 1

| COIL | MEAN RADIUS (CM) | WIDTH (CM) | AXIAL POSITION (CM) | NO. OF TURNS |
|---|---|---|---|---|
| D | 59.47 | 15.98 | 0.00 | 756 |
| C | 60.17 | 8.58 | 18.02 | 696 |
| B | 60.01 | 15.39 | 39.78 | 1040 |
| A | 60.37 | 27.82 | 78.90 | 2820 |
| F | 84.60 | 7.40 | 14.15 | 600 |
| E | 85.08 | 30.78 | 75.39 | 1872 |

TABLE 2

| | SCREENING COILS | | |
|---|---|---|---|
| COIL | WIDTH (CM) | AXIAL POSITION (CM) | NO. OF TURNS |
| c | 1.0 | 16.00 | 10 |
| b | 3.6 | 37.34 | 36 |
| a | 3.1 | 80.13 | 31 |
| f | 3.3 | 14.67 | 33 |
| e | 3.7 | 80.00 | 37 |

What is claimed is:

1. A magnet assembly comprising:
   a first superconducting coil means for generating a second magnetic field, said
   a second superconducting coil means for generating a second magnetic field, said second superconducting coil means being electrically connected in series with said first superconducting coil means, and said first and second superconducting coil means each generating magnetic fields having corresponding components of substantially the same order of magnitude;
   said first and second superconducting coil means being disposed for generating, in combination, a resultant, homogeneous magnetic filed having a total magnetic flux in a working volume, and so that said second magnetic field substantially opposes said first magnetic field externally of said working volume; and
   a plurality of screening coil means, each having a number of turns which is small with respect top the number of turns of said first and second superconducting coil means, electrically connected in series and forming a closed loop for interacting with said first and second superconducting coil means for maintaining said total magnetic flux of said resultant magnetic field at a substantially unchanging level in said working volume and having substantially no effect on the homogeneity of said resultant magnetic field in said working volume.

2. A magnet assembly as claimed in claim 1, wherein at least some of said screening coil means are formed by a wire having a maximum current of approximately 1 ampere.

3. A magnet assembly as claimed in claim 1, wherein at least some of said screening coil means are formed by a superconducting wire having a portion with a maximum current of approximately of 1 ampere.

4. A magnet assembly as claimed in claim 1, wherein at least some of said screening coil means are formed by a superconducting wire having a section of non-superconducting material.

5. A magnet assembly as claimed in claim 1, further comprising:
   a superconducting switch connected in series with said screening coil means; and
   means for periodically heating said superconducting switch for resetting the current in said screening coil means.

* * * * *